United States Patent
Jung et al.

(10) Patent No.: US 12,408,472 B2
(45) Date of Patent: Sep. 2, 2025

(54) WIRE JIG AND TABBING APPARATUS INCLUDING THE SAME

(71) Applicant: HANWHA SOLUTIONS CORPORATION, Seoul (KR)

(72) Inventors: Min Kyo Jung, Seoul (KR); Sung Gyu Jeon, Seoul (KR); Dong Jin Chung, Seoul (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 0 days.

(21) Appl. No.: 18/198,461

(22) Filed: May 17, 2023

(65) Prior Publication Data
US 2023/0378391 A1    Nov. 23, 2023

(30) Foreign Application Priority Data

May 18, 2022    (KR) .......................... 10-2022-0060945

(51) Int. Cl.
| | | |
|---|---|---|
| *H10F 71/00* | (2025.01) | |
| *B23K 3/08* | (2006.01) | |
| *H01L 23/00* | (2006.01) | |
| *B23K 101/38* | (2006.01) | |

(52) U.S. Cl.
CPC ......... *H10F 71/1375* (2025.01); *B23K 3/087* (2013.01); *H01L 24/78* (2013.01); *B23K 2101/38* (2018.08); *H01L 2224/78621* (2013.01)

(58) Field of Classification Search
None
See application file for complete search history.

(56) References Cited

U.S. PATENT DOCUMENTS

2017/0229601 A1*    8/2017   Park ..................... H01L 31/188

FOREIGN PATENT DOCUMENTS

| CN | 101271937 A | * | 9/2008 | ............. B23K 3/087 |
|---|---|---|---|---|
| KR | 10-1113027 B1 | | 2/2012 | |
| KR | 10-2016-0064478 A | | 6/2016 | |
| KR | 20160064478 A | * | 6/2016 | ............. H01L 31/05 |
| KR | 20170076321 A | * | 7/2017 | ............. H01L 31/02 |
| KR | 10-1993843 B1 | | 6/2019 | |
| WO | WO-2019159255 A1 | * | 8/2019 | |

OTHER PUBLICATIONS

Office Action issued on Nov. 24, 2023 by the Korean Patent Office in corresponding KR Patent Application No. 10-2022-0060945.

\* cited by examiner

*Primary Examiner* — Devang R Patel
(74) *Attorney, Agent, or Firm* — Sughrue Mion, PLLC

(57) ABSTRACT

Provided are a wire jig and a tabbing apparatus including the wire jig. The wire jig configured to support at least one wire includes: a main body including a window therein; and at least one support portion arranged to correspond to the window and including at least one support component, wherein the at least one support component is configured to press the at least one wire.

13 Claims, 8 Drawing Sheets

WIRE JIG AND TABBING APPARATUS INCLUDING THE SAME

CROSS-REFERENCE TO RELATED APPLICATION

This application claims priority from Korean Patent Application No. 10-2022-0060945, filed on May 18, 2022, in the Korean Intellectual Property Office, the disclosure of which is incorporated herein in its entirety by reference.

BACKGROUND

1. Field

Embodiments of the disclosure relates to a wire jig and a tabbing apparatus including the same.

2. Description of the Related Art

A solar cell, or a photovoltaic cell, is formed by arranging a p-n junction diode on a substrate. When a solar light is irradiated onto a solar cell, an exciton that is an electron-hole pair is generated, and as the exciton is separated, an electron is moved to an n layer, and a hole is moved to a p layer, and thus, a photovoltaic force is generated in the p-n junction. Tabbing is a process of arranging a wire on a plurality of solar cells and electrically connecting the solar cells to each other, thereby forming one solar cell module.

A tabbing apparatus generally includes a transfer apparatus for transferring a wire, and bonds a solar cell and a wire in a state in which the solar cell is arranged above the wire. In this process, the wire may be displaced, for example, the wire may be lifted, detached from a designated position, and the like, and thus, the wire and the solar cell may not be connected to each other at a desired position or the connection state therebetween may be poor.

The background technology described above is technical information that the inventor possessed for the derivation of the disclosure or acquired in the derivation process of the disclosure, and it cannot be said that it is known technology disclosed to the general public before the filing of the disclosure.

SUMMARY

Provided are a wire jig for supporting one or more wires during connecting a solar cell with the one or more wires, to stably connect the solar cell with the one or more wires, and a tabbing apparatus including the wire jig. However, such an object is an example, and the objective to be solved by the disclosure is not limited to thereto.

According to an embodiment, a wire jig may include a wire jig provided in a tabbing apparatus to support at least one wire, the wire jig including a main body portion including a window therein; and at least one support portion arranged to correspond to the window, and including at least one support component, wherein the at least one support component is configured to press the at least one wire.

In the wire jig according to an embodiment, the shape of each of the at least one support component may be configured to vary according to a contact state with the at least one wire.

In the wire jig according to an embodiment, the at least one support component may be configured to be compressed when contacting the at least one wire to press the at least one wire, and may be an elastic member restored to an original shape when separated from the at least one wire.

In the wire jig according to an embodiment, each of the at least one support component may include a body having an opening therein, and at least one contact member arranged on one side of the body, and configured to contact the at least one wire, and at least one of the body and the at least one contact member is an elastic member.

In the wire jig according to an embodiment, the body may have a ring shape forming a closed contour surrounding the opening.

In the wire jig according to an embodiment, the body may have a pair of long sides in the length direction of the wire jig, and a pair of short sides in the height direction of the wire jig, and the at least one contact member may be arranged on a lower long side of the body.

In the wire jig according to an embodiment, each of the at least one support portion may further include a guide extending in the window, each of the at least one support component may include a connector to connect the guide with the body, and at least one of the guide and the connector may be an elastic member.

In the wire jig according to an embodiment, the at least one contact member may include a plurality of contact members, and the connector may have the length shorter than the body, and may be arranged between the plurality of contact members.

In the wire jig according to an embodiment, the at least one support component may include a plurality of support components arranged spaced apart from each other in the length direction of the wire jig, and the at least one contact member may include a plurality of contact members spaced apart from each other in one of the at least one support component, each of the plurality of contact members contacting the at least one wire.

In the wire jig according to an embodiment, the height of each of the at least one support component may be 50% to 75% of the height of each of the at least one support portion.

In the wire jig according to an embodiment, the height of each of the at least one contact members may be 10% to 40% of the length of one of the pair of long sides of the body.

In the wire jig according to an embodiment, the at least one support portion may include a plurality of support portions arranged spaced apart from each other in the width direction of the wire jig.

In the wire jig according to an embodiment, the at least one wires may include a plurality of wires arranged on a conveyor to be spaced apart from each other, and the plurality of support portions may simultaneously press the plurality of wires to be arranged between an upper surface of the conveyor and the plurality of support portions.

According to an embodiment, a tabbing apparatus for connecting a solar cell with at least one wire includes a wire jig for supporting the at least one wire and a transport apparatus for moving the wire jig, wherein the wire jig may include a main body portion including a window therein, and at least one support portion arranged to correspond to the window and including at least one support component, and the at least one support component is configured to press the at least one wire.

In the wire jig according to an embodiment, the tabbing apparatus may further include a sensor for detecting a contact state between the at least one support portion and the at least one wire, and the transport apparatus may maintain the contact state between the at least one support portion and the at least one wire based on the contact state detected by the sensor.

Other aspects, features, and advantages than those described above will become apparent from the following drawings, claims, and detailed description of the disclosure

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
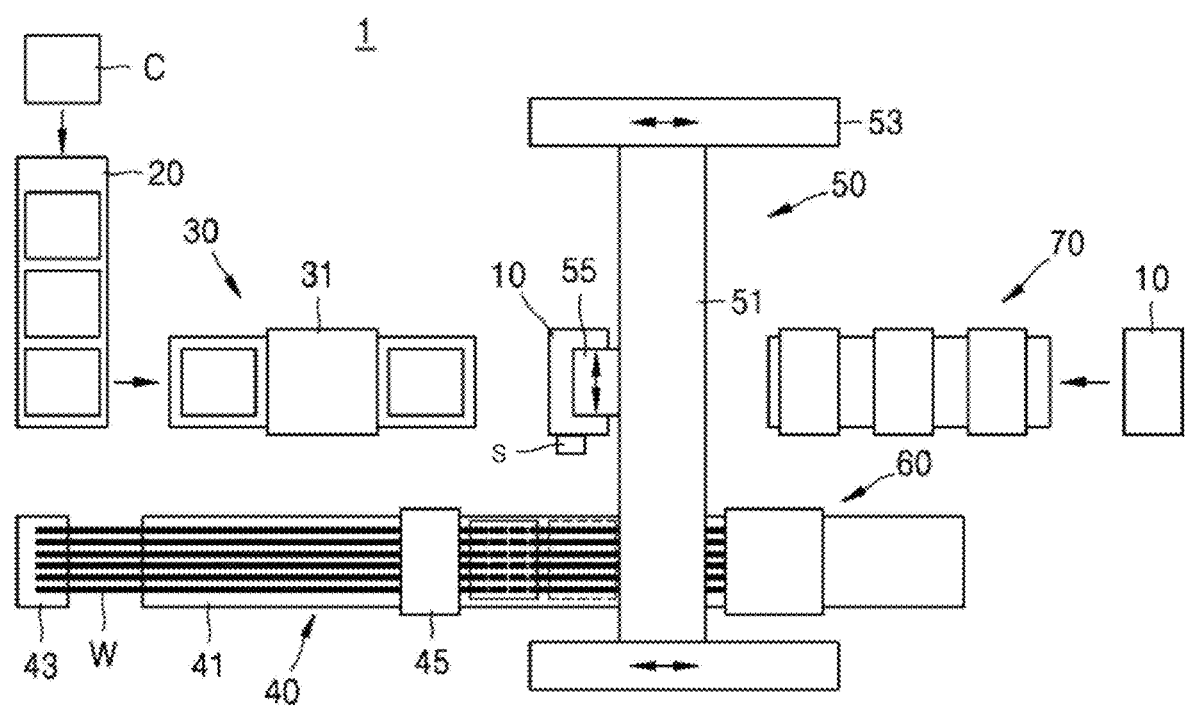
FIG. 1 schematically illustrates a tabbing apparatus according to an embodiment.

Reference will now be made in detail to embodiments, examples of which are illustrated in the accompanying drawings, wherein like reference numerals refer to like elements throughout. The embodiments are example embodiments, and thus, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure. In the description of the embodiments, even though illustrated in other embodiments, the same identification numbers are used for the same components.

In the following embodiments, while terms such as "first," "second," etc., may be used to describe various elements, such elements must not be limited to the above terms, and, the expression of singularity in the specification includes the expression of plurality unless clearly specified otherwise in context.

Sizes of elements in the drawings may be exaggerated for convenience of explanation. For example, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 2:
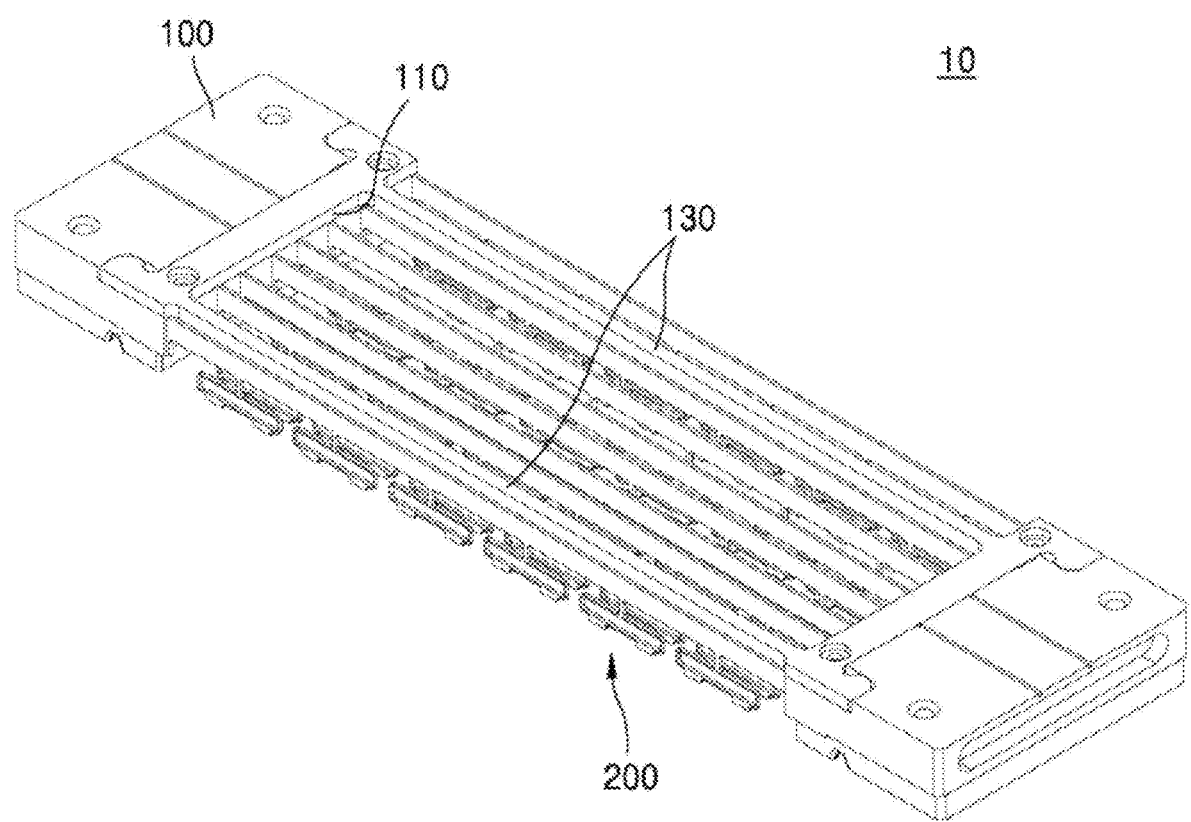
FIG. 2 is a perspective view of a front side of a wire jig according to an embodiment.
Figure 3:
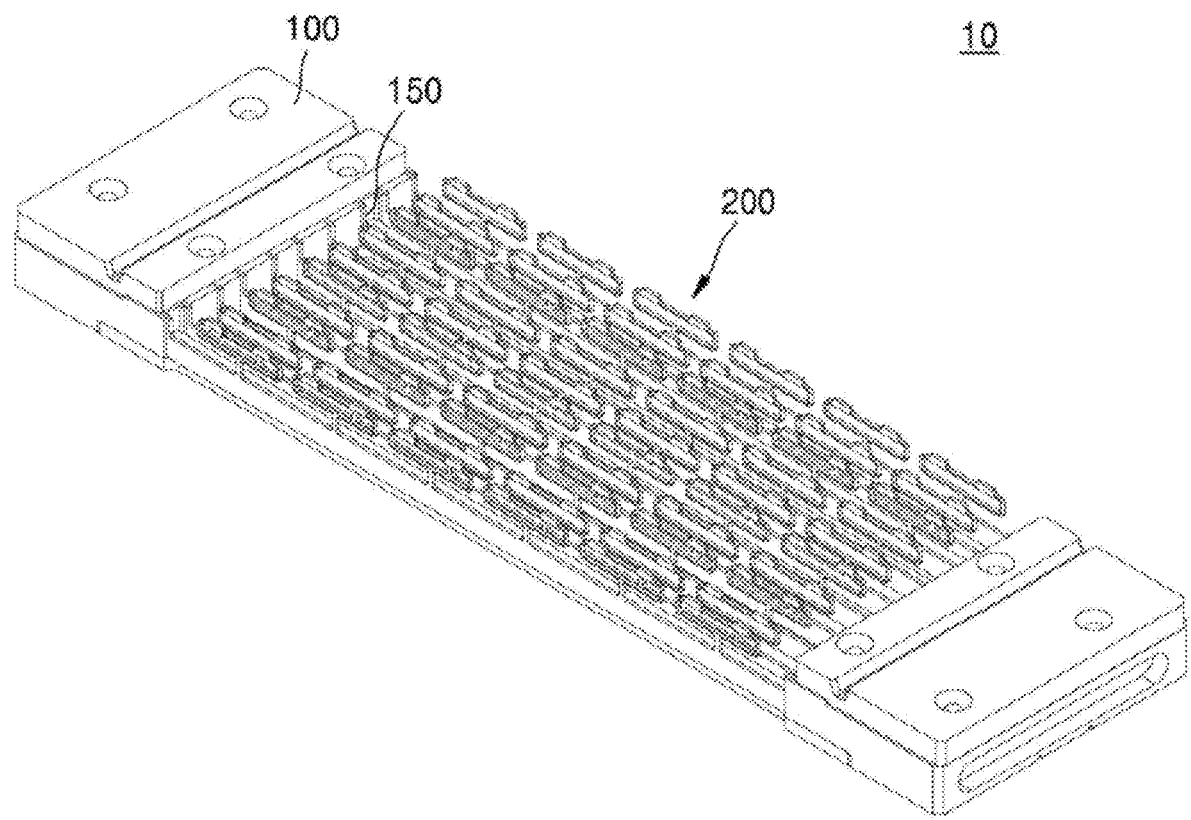
FIG. 3 is a perspective view of a rear side of a wire jig according to an embodiment.
Figure 4:
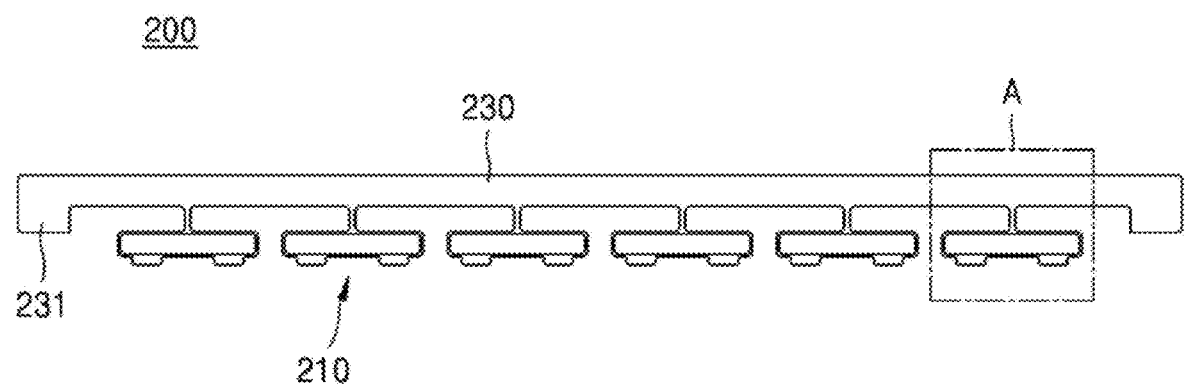
FIG. 4 is a side view of a support portion according to an embodiment.
Figure 5:
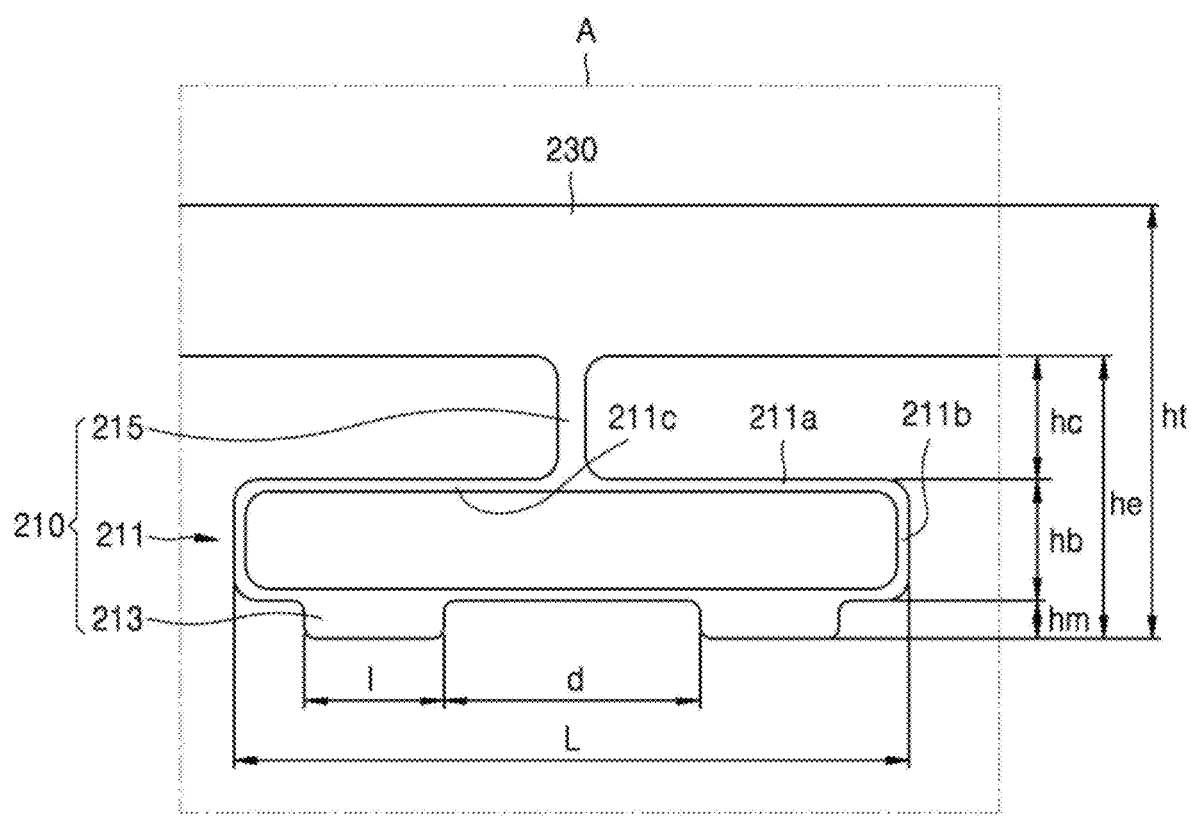
FIG. 5 is an enlarged side view of a support component according to an embodiment.
Figure 6:
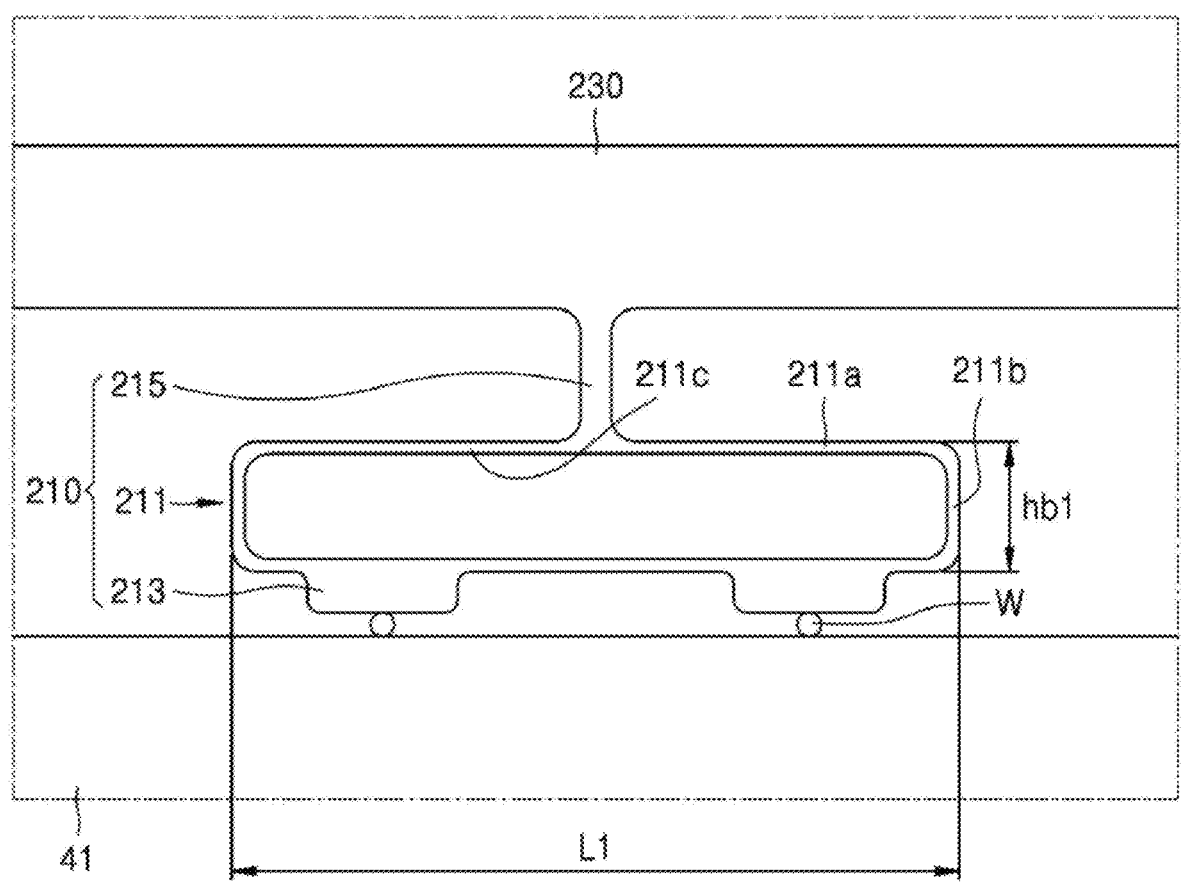
FIGS. 6 and 7 illustrate an operation of a wire jig according to an embodiment.
Figure 7:
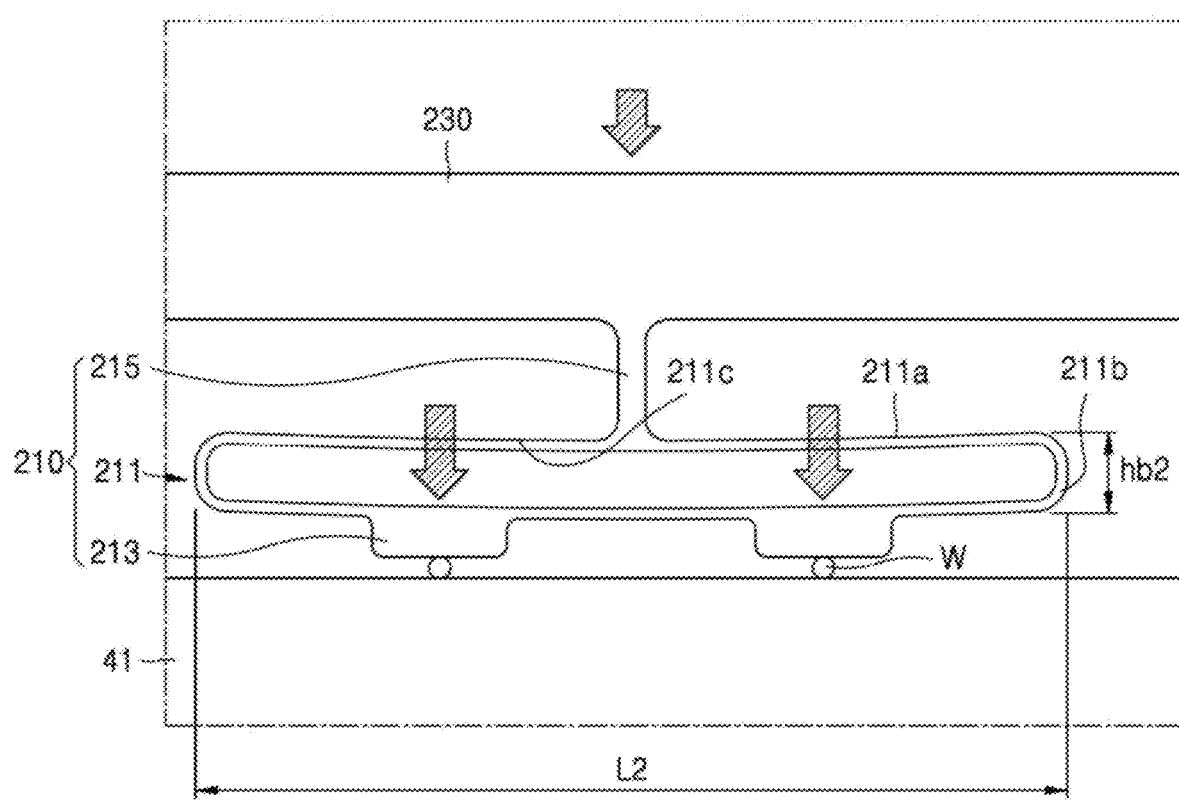

FIG. 1 schematically illustrates a tabbing apparatus 1 according to an embodiment; FIG. 2 is a perspective view of a front side of a wire jig 10 according to an embodiment; FIG. 3 is a perspective view of a rear side of the wire jig 10 according to an embodiment; FIG. 4 is a side view of a support portion 200 according to an embodiment; FIG. 5 is an enlarged side view of a support component 210 according to an embodiment; and FIGS. 6 and 7 illustrate an operation of the wire jig 10 according to an embodiment.

The tabbing apparatus 1 connects a solar cell C with a wire W to form a solar cell module. The solar cell C includes a semiconductor junction region having a p-n junction surface, and when energy of a certain amount or more is irradiated to the solar cell C, an electromotive force is generated to convert light energy into electrical energy. A semiconductor material included in the solar cell C is not particularly limited, and may include silicon (single crystal, polycrystalline, and amorphous), gallium arsenide, cadmium tellurium, cadmium sulfide, indium phosphorus, copper indium gallium selenide (CIGS), organic dye, or a mixture thereof.

The wire W is a conductor for electrically connecting a plurality of solar cells C to each other, and connects a front surface of a solar cell C to a rear surface of an adjacent solar cell C. For example, the wire W may be electrically connected to the solar cell C through a soldering process. Alternatively or additionally, the wire W may be electrically connected to the solar cell C by using an electrical conductive adhesive (ECA).

In an embodiment, the diameter of the wire W may be 0.1 mm to 0.5 mm. For example, the diameter of the wire W may be 0.15 mm to 0.45 mm. As another example, the diameter of the wire W may be 0.2 mm to 0.4 mm. As yet another example, the diameter of the wire W may be 0.26 mm to 0.38 mm.

In an embodiment, as illustrated in FIG. 1, the tabbing apparatus 1 may include a wire jig 10, a solar cell transfer apparatus 20, a solar cell separation apparatus 30, a wire transfer apparatus 40, a transport apparatus 50, a bonding apparatus 60, and a wire jig transfer apparatus 70.

The wire jig 10 is input to the tabbing apparatus 1 by the wire jig transfer apparatus 70 arranged on one side of the tabbing apparatus 1. The wire jig 10 holds the position of the wire W during a tabbing process so that the solar cell C may be well coupled to the wire W. The wire jig 10 is described herebelow.

The solar cell transfer apparatus 20 externally receives and transfers the solar cell C. For example, the solar cell transfer apparatus 20 including a conveyor may move the solar cell C to the solar cell separation apparatus 30. The solar cell C is in a state of not being separated (scribed) into a certain size.

The solar cell separation apparatus 30 may separate the solar cell C received from the solar cell transfer apparatus 20 in a necessary size. For example, the solar cell separation apparatus 30 includes a scriber 31, and the scriber 31 may separate the solar cell C into a plurality of segments by using laser or a mechanical method.

The wire transfer apparatus 40 externally receives and moves one or more wires W. For example, the wire transfer apparatus 40 may include a conveyor 41, a roller 43, and an aligner 45.

The conveyor 41 may have a flat upper surface so that one or more wires W may move in a state of being spaced apart from each other. The roller 43 is arranged in an end portion of the wire transfer apparatus 40, and transfers the wire W in a state of being placed on the upper surface of the conveyor 41. In an embodiment, the roller 43 may be arranged on each of one side and the other side of the wire transfer apparatus 40 such that the conveyor 41 is arranged therebetween. The aligner 45 primarily aligns the wire W before the solar cell C contacts the wire W, that is, the solar cell C is arranged on the wire W. For example, the aligner 45 has grooves or protrusions as many as the number corresponding to the wires W so that the wire W may move along a designated path.

The transport apparatus 50 moves the solar cell C and the wire jig 10 to the wire W. In an embodiment, the transport apparatus 50 may include a first frame 51, a pair of second frames 53, and a transport head 55. The first frame 51 and the second frames 53 are arranged to cross each other, and the first frame 51 may be movably arranged between the second frames 53. Furthermore, the transport head 55 is arranged on one side of the first frame 51 to be movable along the first frame 51, and may pick up an object by an absorption method, a method using an electromagnetic force, or a mechanical method.

In an embodiment, while holding the solar cell C and the wire jig 10, the transport head 55 moves to the wire W, and may place the solar cell C and the wire jig 10 thereon. For example, as illustrated in FIG. 1, the transport head 55 picks up the solar cell C separated by the solar cell separation apparatus 30, and may arranged the solar cell C above the wire W. Furthermore, the transport head 55 picks up the wire jig 10 transferred by the wire jig transfer apparatus 70, and may place the wire jig 10 above the wire W. For example, the transport head 55 makes the wire jig 10 contact the wire W to maintain the wire W at a fixed position, and then, positions the solar cell C on the wire W.

In an embodiment, while maintaining the wire W, the wire jig 10 may move a certain distance or more with the wire W in the wire transfer apparatus 40.

The bonding apparatus 60 may bond the solar cell C and the wire W contacting each other. For example, the bonding apparatus 60 may be a soldering apparatus that coats and heats solder in a connection portion between the solar cell C and the wire W, and bonds the same. Alternatively or additionally, the bonding apparatus 60 may be an apparatus that coats an electrically conductive adhesive in a connection portion between the solar cell C and the wire W and bonds the same.

Referring back to FIGS. 1 to 7, the wire jig 10 according to an embodiment is described.

The wire jig 10 may include a main body portion 100 and a support portion 200.

The main body portion 100 forms an overall frame of the wire jig 10, and the support portion 200 may be arranged on one side of the main body portion 100. The shape of the main body portion 100 is not particularly limited, and for example, as illustrated in FIG. 2, may have a largely thin rectangular prism shape.

In an embodiment, the main body portion 100 may include a window 110 inside. The window 110 may be arranged to overlap at least part of an area in which a plurality of support portions 200 described below are arranged. Accordingly, even when the support portion 200 presses the wire W so that the shape of the support portion 200 is deformed to be displaced in the height direction, the support portion 200 may not interfere with the main body portion 100. In an embodiment, the window 110 may be formed between opposite ends of the main body portion 100 in the length direction.

The main body portion 100 may include a support rib 130. As illustrated in FIG. 2, the support rib 130 may be arranged between the opposite ends of the main body portion 100 in the length direction, and may define the window 110 therein. In an embodiment, the support rib 130 may be provided in a pair to be spaced apart from each other in the width direction. The support rib 130 may prevent the wire jig 10 from being twisted or damaged as the wire jig 10 presses the wire W. In an embodiment, each support rib 130 may be arranged not to overlap the support portion 200. In other words, a plurality of support portions 200 may be arranged between the support ribs 130.

The main body portion 100 may include an insertion groove 150. As illustrated in FIG. 3, the insertion groove 150 may be formed inside the main body portion 100, for example, in inner sides of the opposite ends of the main body portion 100 in the length direction. An insertion protrusion 231 of the support portion 200 described below may be inserted in the insertion groove 150. For example, the insertion groove 150 is open at the bottom and closed at the top. Accordingly, the support portion 200 may be inserted into the insertion groove 150 under the main body portion 100.

In an embodiment, the insertion groove 150 may have a shape with a width decreasing downwardly in FIG. 2 (upwardly in FIG. 3). In other words, the insertion groove 150 may have a V shape downwardly in the thickness direction of the main body portion 100. Accordingly, after the support portion 200 is inserted into the insertion groove 150, the support portion 200 may not be detached in a process in which the wire jig 10 presses the wire W.

The insertion groove 150 may be provided in the same number as the support portion 200, and a pair of insertion grooves 150 may be arranged to face each other with respect to the window 110.

The support portion 200 supports the wire W according to an operation of the wire jig 10. For example, the wire jig 10 is picked up by the transport head 55 of the transport apparatus 50, moved to a designated position on the wire W, and descends to press and support the wire W. The support portion 200 prevents the wire W from being lifted or deviated from the designated position in the transfer process, thereby facilitating the bonding between the solar cell C and the wire W.

In an embodiment, the support portion 200 may be arranged to correspond to one side of the main body portion 100, for example, the window 110. For example, as illustrated in FIGS. 2 and 3, the support portion 200 may include one or more support portions, and may be arranged in an area corresponding to the window 110.

In an embodiment, the support portion 200 may include a plurality of support portions. For example, as illustrated in FIGS. 2 and 3, the support portion 200 may include a plurality of support portions arranged spaced apart from each other in the width direction of the wire jig 10. Accordingly, as the support portions 200 are arranged spaced apart a certain distance from each other in the direction of the wire W, the support portions 200 may support the wire W in a large area.

In an embodiment, the height of the support portion 200 may be 10 mm to 30 mm. For example, the height of the support portion 200 may be 15 mm to 25 mm. As another example, the height of the support portion 200 may be 17 mm to 20 mm. As yet another example, the height of the support portion 200 may be 18.62 mm.

In an embodiment, the length of the support portion 200 may be 100 mm to 300 mm. For example, the length of the support portion 200 may be 150 mm to 250 mm. As another example, the length of the support portion 200 may be 190 mm to 200 mm. As yet another example, the length of the support portion 200 may be 195.75 mm.

In an embodiment, the thickness of the support portion 200 may be 0.1 mm to 3 mm. For example, the thickness of the support portion 200 may be 0.5 mm to 2 mm. As another example, the thickness of the support portion 200 may be 0.7 mm to 1.5 mm. As yet another example, the thickness of the support portion 200 may be 1 mm.

In an embodiment, the shape of the support portion 200 may be deformed by contacting the wire W. For example, the support portion 200 may be an elastic member.

In an embodiment, the material of the support portion 200 may be a metal. For example, the support portion 200 may include alloy steel such as high speed steel that is a kind of high-speed tool steel, not being limited thereto. For example, the support portion 200 may include SKH9 high speed steel. In an embodiment, a support component 210 and a guide 230 of the support portion 200 described below may include the same material.

In an embodiment, the elastic coefficient of the support portion 200 may be 10*106 psi to 100*106 psi. For example, the elastic coefficient of the support portion 200 may be 20*106 psi to 60*106 psi. As another example, the elastic coefficient of the support portion 200 may be 30*106 psi to 50*106 psi. As yet another example, the elastic coefficient of the support portion 200 may be 40*106 psi.

In an embodiment, the support portion 200 may include the support component 210 and the guide 230.

The support component 210 directly supports the wire W. For example, the support component 210 includes one or more support components arranged in the support portion 200, and as the wire jig 10 descends toward the wire W, the support component 210 contacts and presses the wire W against the upper surface of the conveyor 41.

In an embodiment, the support component 210 may include a plurality of support components. As illustrated in FIGS. 2 and 3, the support component 210 may include a plurality of support components arranged spaced apart from each other in the length direction of the wire jig 10. Each support component 210 may support a different wire W. Although six support components are illustrated as the support component 210 in the drawings, the number of support components is not particularly limited, and for example, the support component 210 may include two or more support components.

In an embodiment, the support component 210 may support one or more wires W. For example, one support component 210 may be arranged to correspond to two neighboring wires W.

In an embodiment, the support component 210 may have a shape that varies according to a contact state with the wire W. For example, when not contacting the wire W, the support component 210 may maintain the original shape. When contacting the wire W, the shape of the support component 210 may be deformed according to a contact force. Accordingly, the support component 210 may press the wire W harder with a force to restore the original shape.

In an embodiment, the support component 210 may be an elastic member. For example, the support component 210 is compressed when contacting the wire W and may press the wire W with a restoring force thereof. Furthermore, when separated from the wire W, the support component 210 may be restored to the original shape.

In an embodiment, a height he of the support component 210 may be 50% or more of a height ht of the support portion 200. For example, the height he of the support component 210 may be 55% to 75% of the height ht of the support portion 200. When the height he of the support component 210 is less than 50% of the height ht of the support portion 200, it may be difficult to obtain effective elastic deformation when the support component 210 presses the wire W. Furthermore, when the height he of the support component 210 exceeds 75% of the height ht of the support portion 200, the height he of the support component 210 is too high, and thus, the reliability of a wire supporting process may be deteriorated, for example, the support component 210 is excessively bent when pressing the wire W and the like. As another example, in order to secure the reliability of the support component 210 and effectively fix the wire W, the height he of the support component 210 may be 60% to 70% of the height ht of the support portion 200.

In an embodiment, the support component 210 may include a body 211 and a contact member 213.

The body 211 has an opening 211c therein, and may be deformed by contacting the wire W. For example, when contacting the wire W, the body 211, as an elastic member, may be deformed in the length, height, and width directions. In an embodiment, the body 211 may have a closed contour surrounding the opening 211c.

The shape of the body 211 is not particularly limited, and in an embodiment, the body 211 may include a pair of long sides 211a and a pair of short sides 211b. For example, as illustrated in FIG. 5, the body 211 may have a rectangular shape having a pair of the long sides 211a in the length direction of the wire jig 10, and a pair of the short sides 211b in the height direction of the wire jig 10. Before the deformation of the body 211, the length of each of the long sides 211a may be L, and the length of each of the short sides 211b may be h.

In an embodiment, in order to secure reliability according to the elastic deformation of the body 211 when pressing the wire W, a height hb of the body 211 may be 50% or less of the height he of the support component 210.

The contact member 213 is arranged on one side of the body 211 to directly contact the wire W. For example, the contact member 213 may include one or more contact members arranged on a lower side of the body 211, for example, in a lower one of a pair of the long sides 211a of the body 211, to protrude toward the wire W.

In an embodiment, the contact member 213 may include a plurality of contact members. For example, as illustrated in FIG. 5, the contact member 213 may include two contact members arranged on a lower end portion of the body 211 to be spaced apart from each other by a distance d in the length direction of the wire jig 10. Furthermore, the contact members 213 may each correspond to one wire W. In other words, when the wires W are arranged on the conveyor 41, the contact members 213 included in one support component 210 may be in contact with different wires W.

In an embodiment, the contact member 213 may have a length l. The length l of the contact member 213 may be shorter than the length of each of the long sides 211a of the body 211, and furthermore, shorter than the distance d between the contact members 213 neighboring each other.

For example, the length l of the contact member 213 may be 5 times to 50 times of the diameter of the wire W. For example, the length l of the contact member 213 may be 10 times to 30 times of the diameter of the wire W. When the length l of the contact member 213 is less than 10 times of the diameter of the wire W, during the lowering of the wire jig 10, it is difficult to arrange the wire W in a central area of the contact member 213 so that it may be difficult to effectively support the wire W. When the length l of the contact member 213 exceeds 30 times of the diameter of the wire W, the weight of the support component 210 increases so that a load applied to a connector 215 increases. Accordingly, as the process is repeated, the support portion 200, in particular, the connector 215, may be damaged.

In an embodiment, the length l of the contact member 213 may be 10% to 40% of the length L of each of the long sides 211a of the body 211. For example, the length l of the contact member 213 may be 15% to 35% of the length L of each of the long sides 211a of the body 211. When the length l of the contact member 213 is less than 10% of the length L of each of the long sides 211a, the length l of the contact member 213 is decreased too short so that it may be difficult to effectively press the wire W. When the length l of the contact member 213 exceeds 40% of the length L of each of the long sides 211a, the weight of the support component 210 increases so that the load applied to the connector 215 increases. Accordingly, as the process is repeated, the support portion 200, in particular, the connector 215, may be damaged.

In an embodiment, the length l of the contact member 213 may be 75% to 95% of the distance d between the contact members 213. When the length l of the contact member 213 is less than 75% of the distance d between the contact members 213, it may be difficult for the contact member 213 to effectively press the wire W. When the length l of the contact member 213 exceeds 95% of the distance d between the contact members 213, the weight of the support component 210 increases so that the load applied to the connector 215 increases. Accordingly, as the process is repeated, the support portion 200, in particular, the connector 215, may be damaged.

In an embodiment, the height hm of the contact member 213 may be 20% or less of the height he of the support component 210. In an embodiment, the height hm of the contact member 213 may be less than the height hb of the body 211. Accordingly, the reliability of the support component 210 may be secured, that is, when pressing the wire W, the support component 210 is not deviated from the designated position and is not excessively deformed, and may be firmly support the wire W.

In an embodiment, the body 211 and/or the contact member 213 may be an elastic member. The body 211 and/or the contact member 213 includes a material that is deformable and elastic. Accordingly, when the wire jig 10 contacts the wire W, the body 211 and/or the contact member 213 are deformed so as to press the wire W harder.

In an embodiment, the support component 210 may further include the connector 215. As illustrated in FIG. 5, in order to connect the support component 210 with the guide 230, one side of the connector 215 may be connected to the body 211, and the other side thereof may be connected to the guide 230.

In an embodiment, the connector 215 may be arranged between the contact members 213. For example, as illustrated in FIG. 5, while the two contact members 213 is arranged on one of the long sides 211a of the body 211, one side of the connector 215 may be arranged between the two contact members 213. For example, the connector 215 may be arranged in the middle of the two contact members 213 at the other of the long sides 211a. Accordingly, the support component 210 may uniformly press the wires W.

In an embodiment, the connector 215 may be an elastic member. In other words, when the wire jig 10 contacts the wire W, in addition to the deformation of the body 211 and/or the contact member 213, the connector 215 may be compressed in the length direction to press the wire W harder.

In an embodiment, to secure reliability according to the elastic deformation of the connector 215 when pressing the wire W, the height hc of the connector 215 may be greater than 50% or less of the height he of the support component 210, and the height hc of the connector 215 may be greater than the height hb of the body 211. For example, the height hb of the body 211 may be 90% or more of the height hc of the connector 215. For example, the height hb of the body 211 may be 95% or more of the height hc of the connector 215.

In an embodiment, the support component 210 may include a metal material, for example, SKH9 high speed steel. Furthermore, the body 211, the contact member 213, and the connector 215 of the support component 210 may all include the same material and may be formed integrally.

The guide 230 is arranged on one side of the main body portion 100 to connect the main body portion 100 with the support component 210. In an embodiment, as illustrated in FIGS. 2 to 4, the guide 230 has a rod or thin plate shape extending in the length direction of the wire jig 10, and opposite ends thereof may be connected to inner sides of the opposite ends of the main body portion 100.

In an embodiment, the guide 230 may include a plurality of guides. For example, as illustrated in FIGS. 2 and 3, the guide 230 may include a plurality of guides arranged spaced apart from each other in the width direction of the wire jig 10.

In an embodiment, the guide 230 may be detachably connected to the main body portion 100. For example, as illustrated in FIG. 4, the guide 230 may include the insertion protrusion 231 in the opposite ends in the length direction thereof. As the insertion protrusion 231 protrudes downwardly from the opposite ends of the guide 230, the guide 230 may come in contact with a large area of the insertion groove 150. Furthermore, the guide 230 may be detachably inserted into the insertion groove 150. Accordingly, considering the number, physical properties, and the like of the wires W, the numbers of the guides 230 included in the wire jig 10 and the support components 210 according thereto may be adjusted.

In an embodiment, the guide 230 may be an elastic member. In other words, when the wire jig 10 contacts the wire W, in addition to the deformation of the body 211 and/or the contact member 213, the guide 230 may be compressed in the length direction so as to press the wire W harder.

Next, the operation of the wire jig 10 according to an embodiment is described with reference to FIGS. 1 to 7.

As illustrated in FIG. 1, the solar cell C is transferred by the solar cell transfer apparatus 20 to the solar cell separation apparatus 30 and separated in an appropriate size. Simultaneously or with a time gap, the wire W is transferred by the wire transfer apparatus 40 on the conveyor 41. Furthermore, simultaneously or with a time gap, the wire jig 10 is transferred by the wire jig transfer apparatus 70. The transport head 55 of the transport apparatus 50 is moved to a preset position through the first frame 51 and the second frames 53 to pick up the wire jig 10. Then, the transport head 55 is moved to the conveyor 41 in which the wire W is placed and positions the wire jig 10 on the wire W.

For example, as illustrated in FIG. 6, the transport head 55 is moved to a preset position so that the wire jig 10 may contact the wire W. In an embodiment, the tabbing apparatus 1 may include a sensor S to check a contact state with the wire W. For example, the sensor S may be arranged in the transport head 55 and/or the wire jig 10. The sensor S may detect a contact state between the support portion 200 and the wire W.

The sensor S may be an electromagnetic sensor to check the contact state through electrical connection with the wire W that is a conductor. Alternatively or additionally, the sensor S may be a pressure sensor to check the contact state by measuring a pressure between the wire W and the support portion 200. For example, when a current detected by the sensor S is a certain value or more, the tabbing apparatus 1 may determine that the contact state of the wire W and the wire jig 10 is good. Alternatively, when a pressure detected by the sensor S is a certain value or more, the tabbing apparatus 1 may determine that the contact state of the wire W and the support portion 200 is good. Furthermore, the transport apparatus 50 may maintain the contact state between the support portion 200 and the wire W based on the contact state detected by the sensor S.

Although the drawings illustrate that one support component 210 contacts two wires W, the disclosure is not limited thereto. When one of the support components 210 contacts the wire W, the other support components 210 may contact the wire W. In other words, the support components 210 may simultaneously contact the wire W corresponding thereto.

Next, the tabbing apparatus 1 moves the transport head 55 downwardly so that the wire jig 10 may press the wire W. For example, as illustrated in FIG. 7, when the support component 210 is in contact with the wire W, the transport head 55 makes the wire jig 10 press the wire W downwardly, that is, in a direction perpendicular to the ground or the conveyor 41. Accordingly, as the shape of the support component 210 changes, the support component 210 presses the wire W on the conveyor 41 to support the wire W.

For example, as illustrated in FIG. 7, as the body 211 that is an elastic member receives a force in a vertical direction, the long sides 211*a* of the body 211 are bent downwardly so that the length L of each of the long sides 211*a* of the body 2111 is changed to L2, and a length hb1 of each of the short sides 211*b* is changed to a length hb2. As the shape of the body 211 changes, the wire W may be firmly supported by a restoring force of the body 211 to return to the original shape. Furthermore, when the support portion 200 is entirely formed of an elastic member, elements other than the body 211 may be elastically deformed by contacting the wire W. For example, the contact member 213, the connector 215, and the guide 230 may be elastically deformed in a direction perpendicular to the height direction through the contact with the wire W.

Although the drawings illustrate that only the body 211 is an elastic member, the disclosure is not limited thereto. As described above, in addition to the body 211, the contact member 213, the connector 215, and/or the guide 230 may be elastic members. Accordingly, as the shapes of the contact member 213, the connector 215, and/or the guide 230 change, the wire W may be firmly supported by a restoring force of the body 211.

In an embodiment, the transport head 55 may uniformly maintain a pressurization state of the wire W through the sensor S. For example, to maintain the current value or pressure value detected by the sensor S within a preset range, the transport head 55 may press the wire jig 10 against the wire W.

Then, when the process of placing the solar cell C on the wire W is complete, the transport head 55 picks up the wire jig 10 to remove the pressurization state. Then, the solar cell C and the wire W are moved by the wire transfer apparatus 40 to the bonding apparatus 60, and electrically connected to each other forming a solar cell module.

Through the above configuration, the wire jig 10 and a tabbing apparatus 1 including the wire jig 10, according to an embodiment, prevent the lifting of the wire W or the displacement of the wire W during the connection of the solar cell C and the wire W, thereby facilitating the connection of the solar cell C and the wire W at the designated position.

Figure 8:
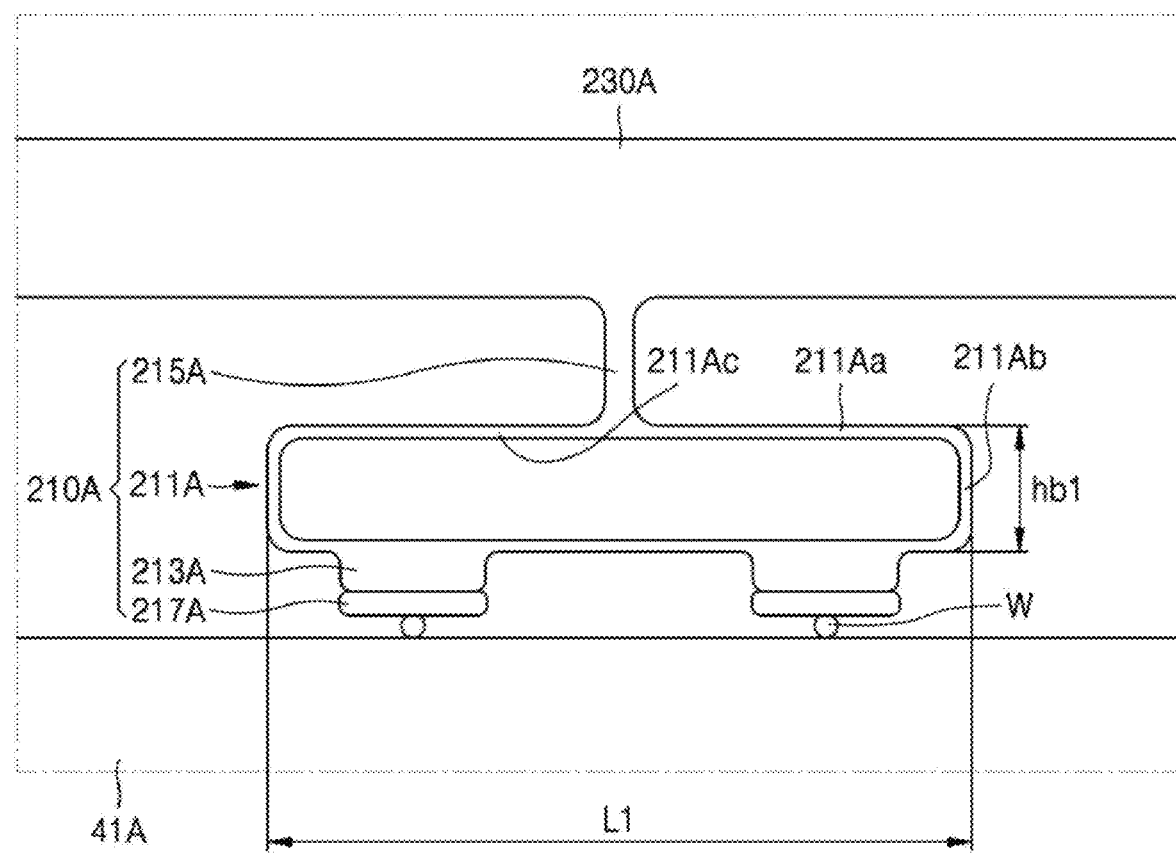
FIGS. 8 and 9 illustrate an operation of a wire jig according to another embodiment.
Figure 9:
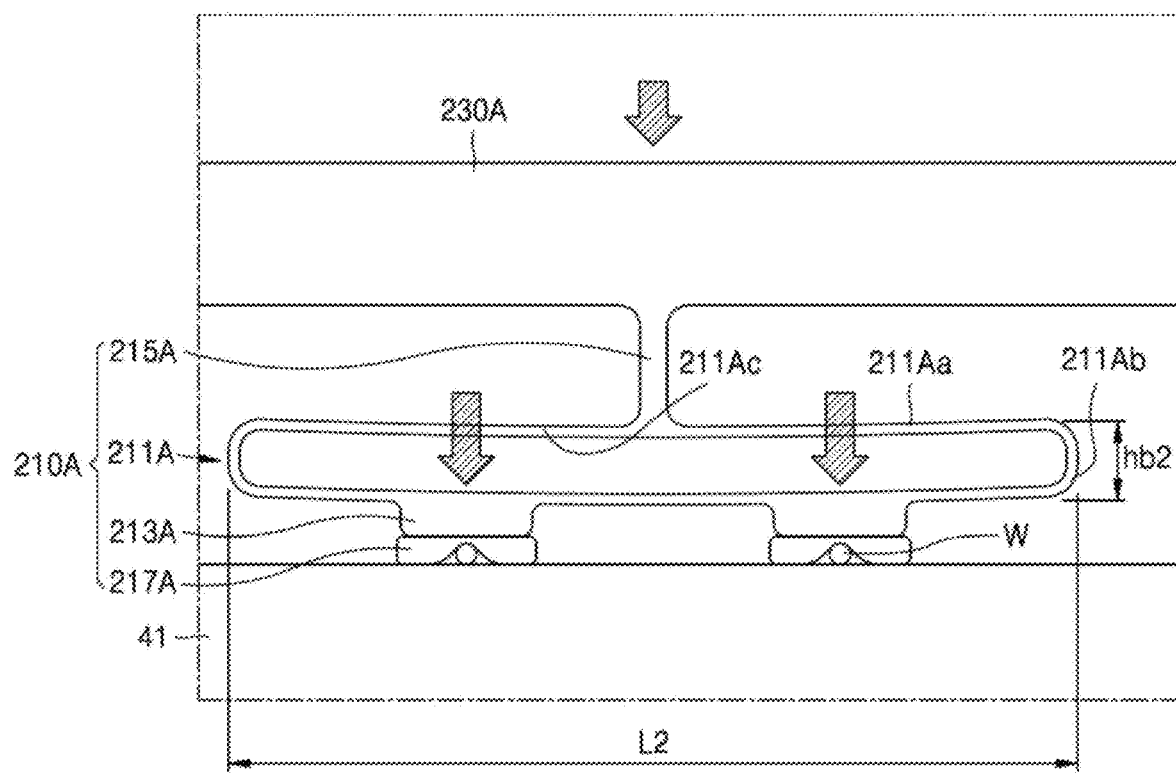

FIGS. 8 and 9 illustrate an operation of the wire jig 10 according to another embodiment.

The wire jig 10 according to the present embodiment may have a support component 210A, and a configuration of the support component 210A may be different from a configuration of the support component 210 according to the embodiment described above. For example, the support component 210A may further include a reinforcement member 217A. The other configuration of the support component 210A may be the same as the configuration of the support component 210, detailed descriptions thereof are omitted.

As illustrated in FIGS. 8 and 9, the support component 210A may further include the reinforcement member 217A in an end portion of a contact member 213A. The reinforcement member 217A may be arranged on one surface of the contact member 213A, for example, a lower surface facing the wire W. The reinforcement member 217A may be arranged to correspond to each contact member 213A. The reinforcement member 217A may have the same area as the contact member 213A. Alternatively, the reinforcement member 217A may have an area greater than or smaller than the contact member 213A.

In an embodiment, the reinforcement member 217A may include a material that is deformable and flexible. For example, the reinforcement member 217A may include a material, such as rubber, silicon, and the like, being deformable and having a high friction coefficient. Accordingly, when the wire jig 10 presses the wire W, the wire W may be surely prevented from being deviated from the designated position.

While the reinforcement member 217A is in contact with the wire W, when the wire jig 10 presses the wire W downwardly, that is, in the direction perpendicular to the ground or the conveyor 41, as illustrated in FIG. 9, a body 211A, the contact member 213A, a connector 215A, and/or a guide 230A are deformed so as to support the wire W. In detail, as a long side 211Aa of the body 211A is bent downwardly, the length of the long side 211Aa may be changed from L1 to L2, and the length of a short side 211Ab may be changed from hb1 to hb2. Furthermore, the contact member 213A, the connector 215A, and the guide 230A may be elastically deformed.

Furthermore, in addition thereto, the reinforcement member 217A may be deformed to encompass the wire W. Accordingly, while the wire jig 10 presses the wire W, the wire W may be firmly supported, and the wire W may be prevented from being deviated from the designated position while being pressed.

In an embodiment, at least a portion of the reinforcement member 217A in a deformed state may be in contact with the upper surface of the conveyor 41. For example, as illustrated in FIG. 9, the opposite ends in the length direction of the reinforcement member 217A are in contact with the upper surface of the conveyor 41, and thus, the reinforcement member 217A may be deformed to encompass the wire W between the upper surface of the conveyor 41 and the reinforcement member 217A. Accordingly, the wire W may be firmly supported.

The wire jig and the tabbing apparatus including the wire jig, according to the above embodiments, may prevent the lifting and positional deviation of the wire when the solar cell is coupled to the wire, thereby facilitating the connection of the solar cell and the wire.

In an actual device corresponding to the above embodiments, a connection between the constituent elements may be indicated by various functional connections, physical connections, or circuit connections that can be replaced or added. Furthermore, no item or component is essential to the practice of the disclosure unless the element is specifically described as "essential" or "critical."

The use of terms "a" and "an" and "the" and similar referents in the context of describing the disclosure are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Furthermore, the steps of all methods described herein can be performed in any suitable order unless otherwise indicated herein or otherwise clearly contradicted by context. Embodiments are not necessarily limited by the order of description of the steps. The use of any and all examples, or language (e.g., "such as") provided herein, is intended merely to better illuminate the disclosure and does not pose a limitation on the scope of the disclosure unless otherwise claimed. Furthermore, numerous modifications and adaptations will be readily apparent to those of ordinary skill in this art without departing from the spirit and scope of the disclosure.

What is claimed is:

1. A wire jig provided in a tabbing apparatus to support at least one wire, the wire jig comprising:
    a main body comprising a window therein; and
    at least one support portion arranged to correspond to the window, and comprising at least one support component,
    wherein the at least one support component is configured to press the at least one wire, and
    wherein each of the at least one support component comprises:
    a body having an opening therein; and
    at least one contact member protruding toward the at least one wire from one side of the body, and configured to contact the at least one wire,
    wherein at least one of the body and the at least one contact member is an elastic member,
    wherein the body has a pair of long sides in a length direction of the wire jig, and a pair of short sides in a height direction of the wire jig,
    wherein the at least one contact member is arranged on a lower long side of the body, and
    wherein a height of each of the at least one contact member is 10% to 40% of a length of one of the pair of long sides of the body.

2. The wire jig of claim 1, wherein a shape of each of the at least one support component is configured to vary according to a contact state with the at least one wire.

3. The wire jig of claim 1, wherein the at least one support component is configured to be compressed when contacting the at least one wire to press the at least one wire, and
    wherein the at least one support component is an elastic member restored to an original shape when separated from the at least one wire.

4. The wire jig of claim 1, wherein the body has a ring shape forming a closed contour surrounding the opening.

5. The wire jig of claim 1, wherein each of the at least one support portion further comprises a guide extending in the window,
    wherein each of the at least one support component comprises a connector to connect the guide with the body, and
    wherein at least one of the guide and the connector is an elastic member.

6. The wire jig of claim 5, wherein the at least one contact member comprises a plurality of contact members, and
    wherein the connector has a length shorter than the body, and is arranged between the plurality of contact members.

7. The wire jig of claim 1, wherein the at least one support component comprises a plurality of support components arranged spaced apart from each other in a length direction of the wire jig,
    wherein the at least one contact member comprises a plurality of contact members spaced apart from each other in one of the plurality of support components, and
    wherein each of the plurality of contact members is configured to contact each of the at least one wire.

8. The wire jig of claim 1, wherein a height of each of the at least one support component is 50% to 75% of a height of each of the at least one support portion.

9. The wire jig of claim 1, wherein the at least one support portion comprises a plurality of support portions arranged spaced apart from each other in a width direction of the wire jig.

10. The wire jig of claim 9, wherein the at least one wire comprises a plurality of wires arranged on a conveyor to be spaced apart from each other, and
    wherein the plurality of support portions simultaneously are configured to press the plurality of wires to be arranged between an upper surface of the conveyor and the plurality of support portions.

11. The wire jig of claim 1, wherein the at least one support component is configured to elastically press the at least one wire.

12. A tabbing apparatus for connecting a solar cell with at least one wire, the tabbing apparatus comprising a wire jig for supporting the at least one wire and a transport apparatus for moving the wire jig,
    wherein the wire jig comprises:
    a main body portion comprising a window therein; and
    at least one support portion arranged to correspond to the window, and comprising at least one support component, and
    wherein the at least one support component is configured to press the at least one wire, and
    wherein the tabbing apparatus further comprises a sensor for detecting a contact state between the at least one support portion and the at least one wire, and
    wherein the transport apparatus is configured to maintain the contact state between the at least one support portion and the at least one wire, based on the contact state detected by the sensor.

13. The tabbing apparatus of claim 12, wherein the at least one support component is configured to elastically press the at least one wire.

\* \* \* \* \*